(12) United States Patent
Bell et al.

(10) Patent No.: US 6,500,756 B1
(45) Date of Patent: Dec. 31, 2002

(54) METHOD OF FORMING SUB-LITHOGRAPHIC SPACES BETWEEN POLYSILICON LINES

(75) Inventors: Scott A. Bell, San Jose, CA (US); Philip A. Fisher, Foster City, CA (US); Richard C. Nguyen, Fremont, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/184,251

(22) Filed: Jun. 28, 2002

(51) Int. Cl.$^7$ .................................. H01L 21/4763
(52) U.S. Cl. .................. 438/639; 438/647; 438/657
(58) Field of Search ................. 438/639, 647, 438/657

(56) References Cited

U.S. PATENT DOCUMENTS 6,372,636 B1 * 4/2002 Chooi et al. ............ 438/639
2001/0003667 A1 * 6/2001 Ahn et al. ............... 438/647
2002/0055230 A1 * 5/2002 Chang .................... 438/258

* cited by examiner

*Primary Examiner*—John F. Niebling
*Assistant Examiner*—Lynne Gurley
(74) *Attorney, Agent, or Firm*—Foley & Lardner

(57) ABSTRACT

A method of forming spaces between polysilicon lines can include patterning structures having top SiON layers and bottom amorphous carbon layers where the structures are located over a polysilicon layer and are separated by a first width, forming amorphous carbon spacers along lateral side walls of the patterned structures, etching apertures into the polysilicon layer not covered by the amorphous carbon spacers and the patterned structures where the apertures in the polysilicon layer between adjacent patterned structures have a second width, and ashing away the amorphous carbon spacers and the patterned structures. The second width is less than the first width.

20 Claims, 6 Drawing Sheets

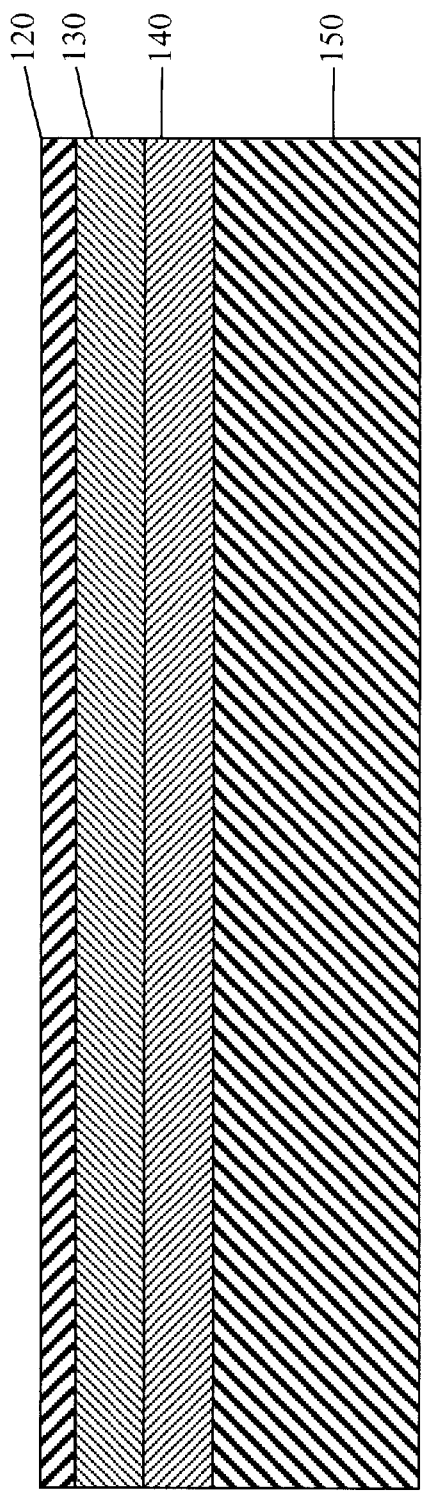
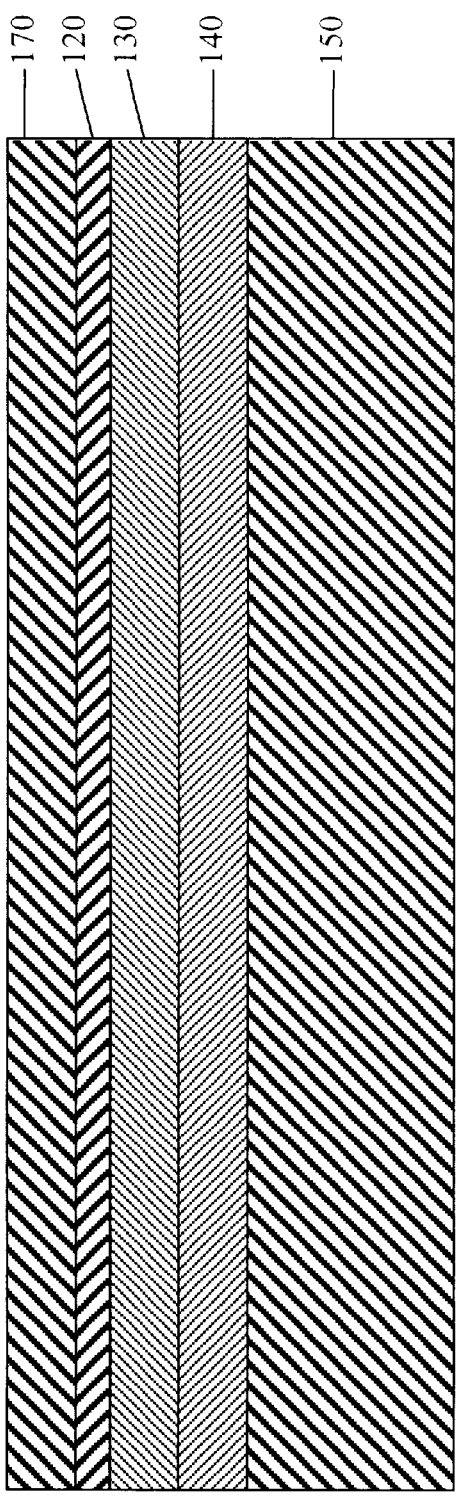
FIGURE 2
FIGURE 3

METHOD OF FORMING SUB-LITHOGRAPHIC SPACES BETWEEN POLYSILICON LINES

FIELD OF THE INVENTION

The present disclosure relates generally to integrated circuits and methods of manufacturing integrated circuits. More particularly, the present disclosure relates to a method of forming sub-lithographic spaces between polysilicon lines.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). ICs often include flash memory cells.

Generally, a transistor is covered by a high temperature oxide and an interlevel dielectric to insulate it from subsequently formed metal layers. An aperture or hole is etched through the interlevel dielectric and the high temperature oxide. The hole is filled with a conductive material to provide connections to the transistor, to conductors, or other circuit structures. For example, a contact can extend from the bit line through the interlevel dielectric to the drain of the transistor. In another example, a contact or conductive via can extend through the interlevel dielectric to connect to the gate stack.

As transistors disposed on integrated circuits (ICs) become smaller (e.g., transistors with gate lengths approaching 50 nm), CMOS fabrication processes must scale the dimensions of the transistors. That is, there must be proportional operational characteristics of structural elements in the ultra-small dimensions of a sophisticated transistor.

One problem associated with CMOS scaling involves forming of smaller and smaller apertures or spaces used in a variety of ways during the IC fabrication process. One way to shrink the critical dimension of "space" features, such as holes and trenches, is with the formation of spacers.

According to conventional processes, an aperture is lithographically formed in a hard mask layer above an underlying layer. The aperture is formed by patterning a photoresist layer above an anti-reflective coating (ARC). A spacer material is conformally deposited in the aperture and stripped in an etch back process. The etch-back process leaves spacers adjacent the side walls of the aperture, thereby shrinking the size of the aperture. The underlying layer is processed using the aperture including the spacers.

Heretofore, conventional spacer formation processes requires the removal of the anti-reflective coating (ARC) and the hard mask after processing. This removal process can damage underlying films, such as oxide-nitride-oxide (ONO) films utilized in flash memory cells and other integrated circuits. There are other drawbacks to the conventional process as well.

Thus, there is a need to form integrated circuits using non-conventional lithographic techniques. Further, there is a need to form spaces smaller than achievable through conventional lithographic methods. Even further, there is a need to avoid damaging underlying films during removal of anti-reflective coating (ARC) and hard masks.

SUMMARY OF THE INVENTION

An exemplary embodiment relates to a method of forming spaces between polysilicon lines. The method can include patterning structures having top SiON layers and bottom amorphous carbon layers where the structures are located over a polysilicon layer and are separated by a first width. The method can also include forming amorphous carbon spacers along lateral side walls of the patterned structures, etching apertures into the polysilicon layer not covered by the amorphous carbon spacers and the patterned structures where the apertures in the polysilicon layer have a second width, and ashing away the amorphous carbon spacers and the patterned structures. The second width is less than the first width.

Another exemplary embodiment relates to a method of forming structures having sub-lithographic spacing. The method can include patterning a first stack having a layer of amorphous carbon and a second stack having a layer of amorphous carbon, and forming amorphous carbon spacers along lateral side walls of the first stack and the second stack. The method also includes etching a layer located below the first and second stacks using the first and second stacks and amorphous carbon spacers as a mask to leave at least two features, and removing the first and second stacks and the amorphous carbon spacers. The first stack and the second stack are separated by a first width. The distance between the at least two features is less than the first width.

Another exemplary embodiment relates to a method of forming spaces between polysilicon lines. The method can include patterning SiON on amorphous carbon to form first and second stacks separated by a first width, and depositing and etching amorphous carbon to form spacers along side walls of the first and second stacks. The method also includes etching a polysilicon layer below the first and second stacks using the first and second stacks and spacers as a mask, and ashing away the first and second stack and the spacers.

Other principle features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and:

FIG. 2 is a schematic cross-sectional view representation of a portion of an integrated circuit, showing a stack application step in accordance with an exemplary embodiment;

FIG. 3 is a schematic cross-sectional view representation of the portion of the integrated circuit of FIG. 2, showing a photoresist application step;

DETAILED DESCRIPTION OF EXEMPLARY EMBODIMENTS

Figure 1:
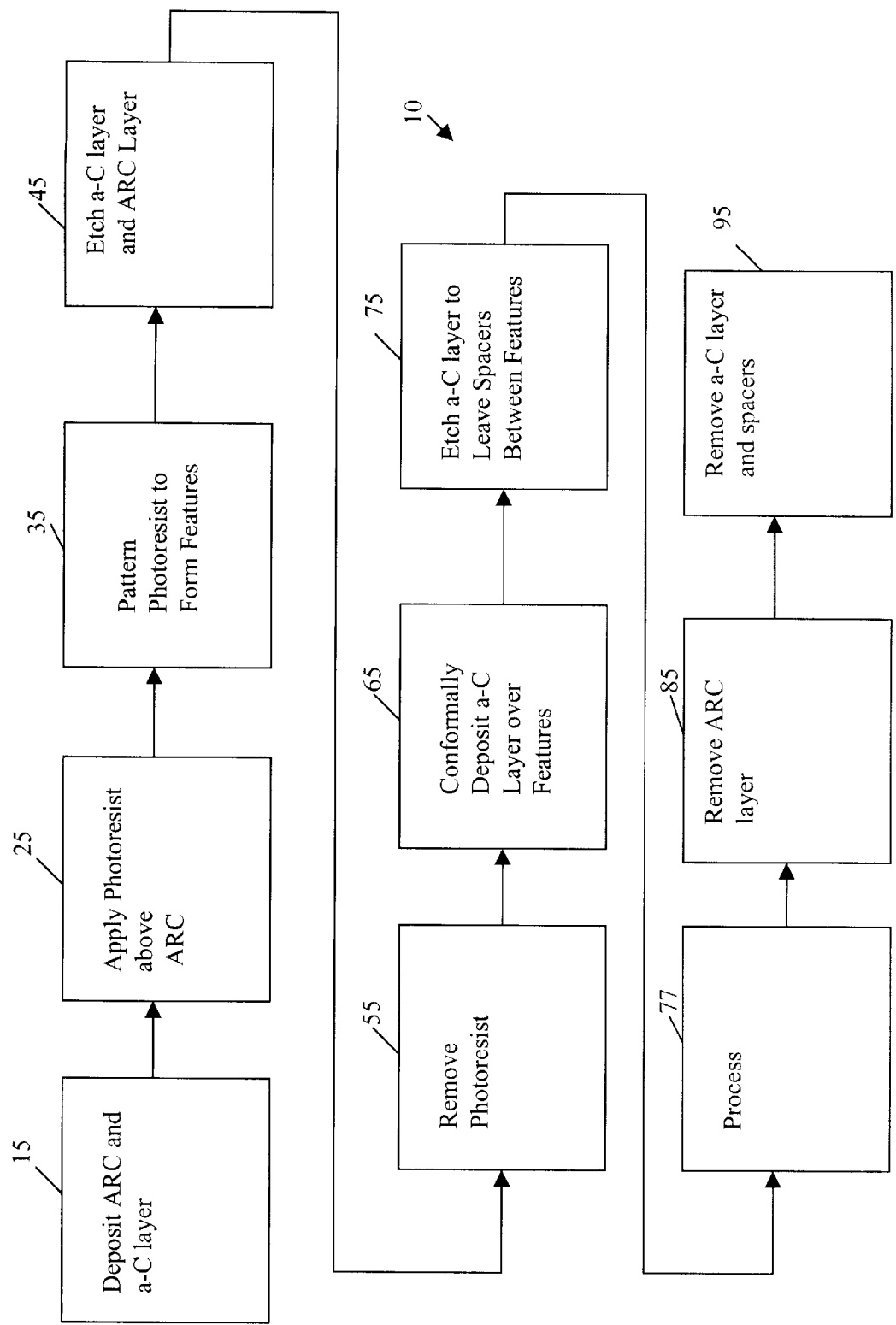
FIG. 1 is a flow diagram for a process of forming sub-lithographic spaces between polysilicon lines in accordance with an exemplary embodiment.

FIG. 1 illustrates a flow diagram 10 of an exemplary process of forming sub-lithographic spaces between polysilicon lines. Flow diagram 10 illustrates by way of example some steps that may be performed. Additional steps, fewer steps, or combination of steps may be utilized in various different embodiments.

In an exemplary embodiment, a step 15 is performed in which an anti-reflective coating (ARC) layer and an amorphous carbon layer are applied above a polysilicon layer which is applied above a substrate or underlying layer. An exemplary stack application step is described below with reference to FIG. 2. In a step 25, a photoresist layer is applied above the ARC layer.

In a step 35, the photoresist layer is patterned to form features. The photoresist layer can be patterned in a variety of different ways, such as, conventional DUV or i-line photolithography, e-beam, x-ray, or EUV lithography. One photoresist patterning operation is described below to reference to FIG. 4. In a step 45, the amorphous carbon layer and ARC layer are etched using the patterned photoresist layer as a mask. The amorphous carbon layer and ARC layer can be etched using a variety of different techniques, such as plasma etching or reactive ion etching. One amorphous carbon layer and ARC layer etching operation is described with reference to FIG. 5.

In a step 55, the photoresist layer is removed. The photoresist layer can be removed using a variety of different techniques, such as plasma ashing with $O_2$-based chemistries. In a step 65, an amorphous carbon layer is conformally deposited over the features. The amorphous carbon layer can be conformally deposited over features using a variety of techniques, such as, chemical vapor deposition (CVD). One amorphous carbon layer conformal deposition operation is described below with reference to FIG. 7.

In a step 75, the amorphous carbon layer is etched to leave spacers between the features. The amorphous carbon layer can be etched using a variety of different techniques, such as plasma etching or reactive ion etching. One spacer formation operation is described below with reference to FIG. 8.

In a step 77, the portion of the integrated circuit is processed in order to etch the underlying gate electrode, for example forming the word line in a flash device. In a step 85, the ARC layer is removed. A variety of different techniques may be used to remove the ARC layer, such as hot phosphoric acid in the case of SiN, or preferably, the ARC layer is removed in-situ during the polysilicon etch, thus avoiding attack of an underlying ONO layer. One ARC layer removal operation is described below with reference to FIG. 9.

In a step 95, the amorphous carbon layer and amorphous carbon spacers are removed. A variety of techniques may be used to remove the amorphous carbon layer and amorphous carbon spacers, such as ashing. One amorphous carbon layer and amorphous carbon spacer removal operation is described below with reference to FIG. 10.

Referring to FIG. 2, a portion 100 of an integrated circuit includes anti-reflective coating (ARC) layer 120, an amorphous carbon layer 130, a polysilicon layer 140, and a substrate 150. ARC layer 120 can be a layer including silicon oxide nitride (SiON). While a SiON material is preferably used in ARC layer 120, alternatively other oxides and suitable materials can be used. In an exemplary embodiment, ARC layer 120 has a thickness of 5 to 100 nm subject to antireflective properties. ARC layer 120 is provided above amorphous carbon layer 130. Amorphous carbon layer 130 has a thickness of, for example, 30 to 100 nm. ARC layer 120 and amorphous carbon layer 130 can be deposited using any variety of deposition techniques, such as chemical vapor deposition (CVD).

Polysilicon layer 140 can have a thickness of 50 to 150 nm and can include amorphous Si, Poly SiGe, doped polysilicon or multilayers of the above with various deposition conditions. In at least one exemplary embodiment, an oxide-nitride-oxide (ONO) layer can be disposed directly between substrate 150 and polysilicon layer 140. Alternatively, other materials can replace the ONO layer, such as gate dielectric materials, high-K gate dielectric materials, silicon dioxide, etc.

FIG. 3 illustrates portion 100 after application of a photoresist layer 170. Photoresist layer 170 is provided above ARC layer 120 and can have a thickness of between 100 nm and 500 nm. In an exemplary embodiment, photoresist layer 170 can be provided using a spin-on technique.

Figure 4:
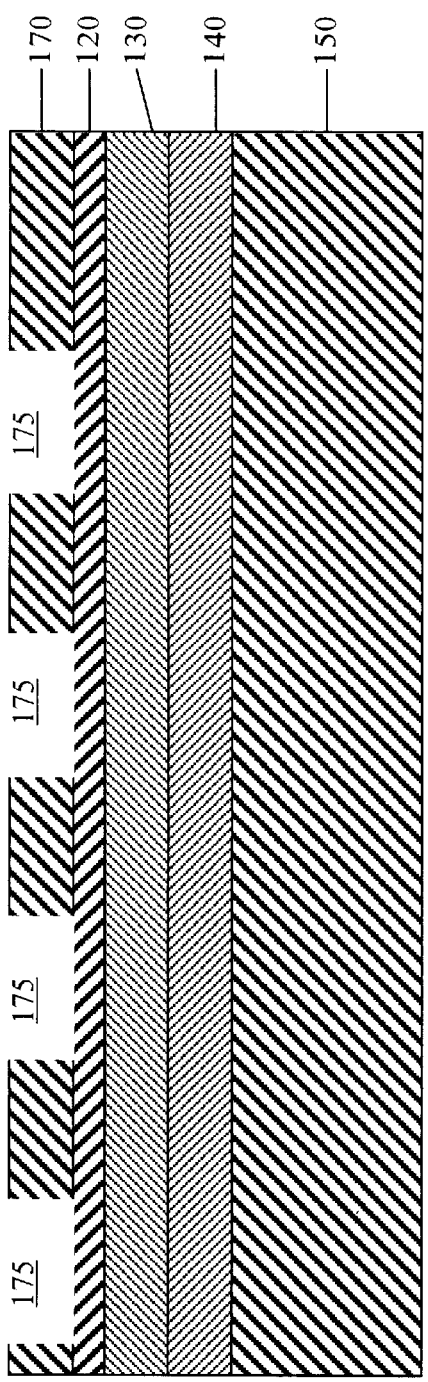
FIG. 4 is a schematic cross-sectional view representation of the portion of the integrated circuit of FIG. 2, showing a photoresist patterning step.

FIG. 4 illustrates portion 100 after patterning of photoresist layer 170. Photoresist layer 170 can be patterned to form apertures 175. In an exemplary embodiment, apertures 175 have a critical dimension (i.e., width) of 130 nm. Alternatively, apertures 175 can have critical dimensions of between 50 nm and 300 nm.

Figure 5:
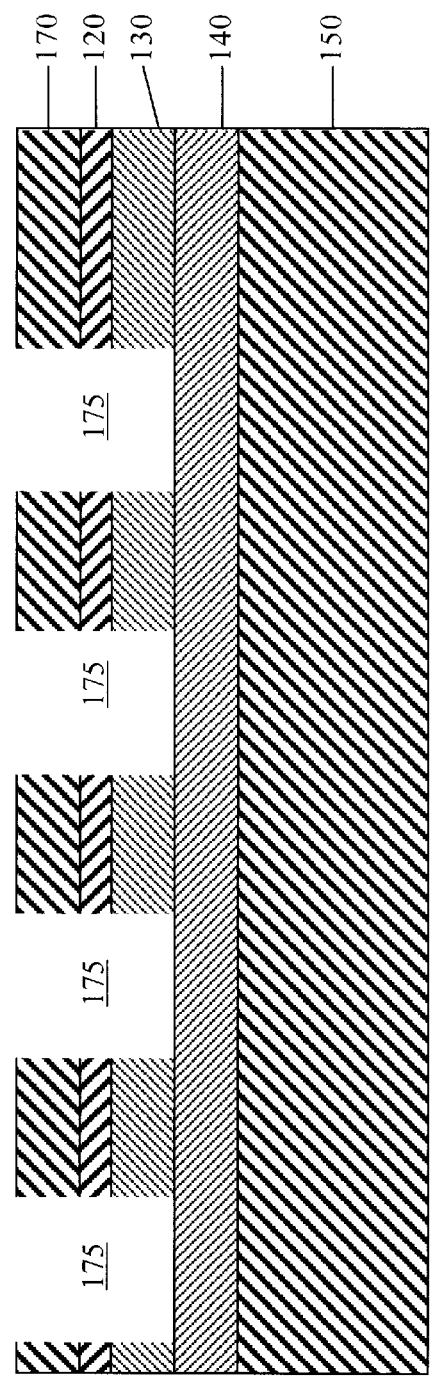
FIG. 5 is a schematic cross-sectional view representation of the portion of the integrated circuit of FIG. 2, showing an etching step.

FIG. 5 illustrates portion 100 after etching ARC layer 120 and amorphous carbon layer 130 to extend apertures 175 into ARC layer 120 and amorphous carbon layer 130. A variety of techniques may be used to extend aperture 175 into ARC layer 120 and amorphous carbon layer 130. In an exemplary embodiment, plasma etching or reactive ion etching is used.

Figure 6:
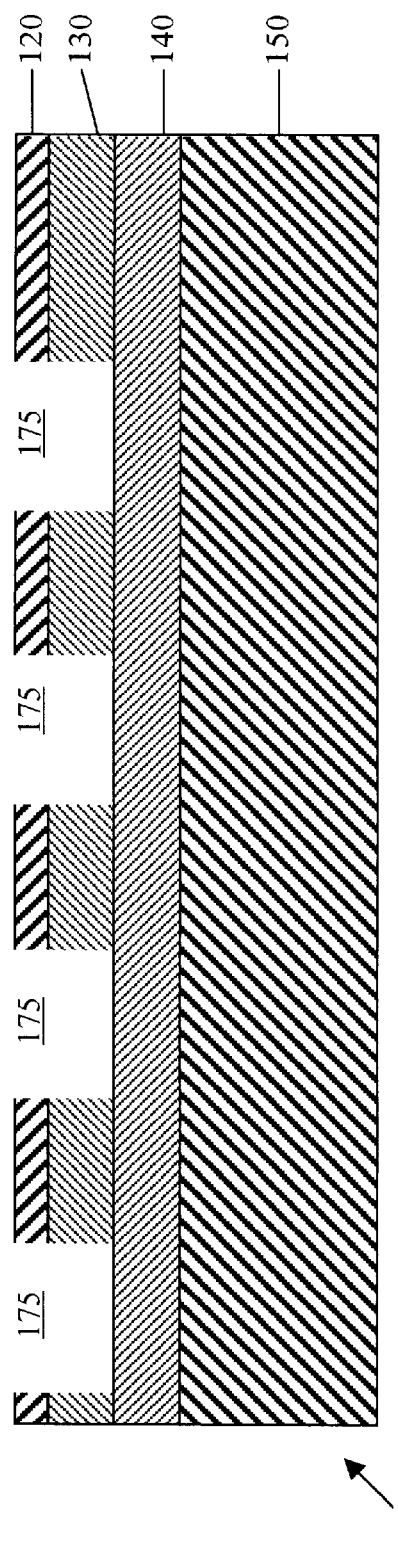
FIG. 6 is a schematic cross-sectional view representation of the portion of the integrated circuit of FIG. 2, showing a photoresist removal step.

FIG. 6 illustrates portion 100 after removal of photoresist layer 170. Photoresist layer 170 can be removed using a oxygen plasma ash process. In an alternative embodiment, photoresist layer 170 can be removed during the etching of amorphous carbon layer 130 described with reference to FIG. 5.

Figure 7:
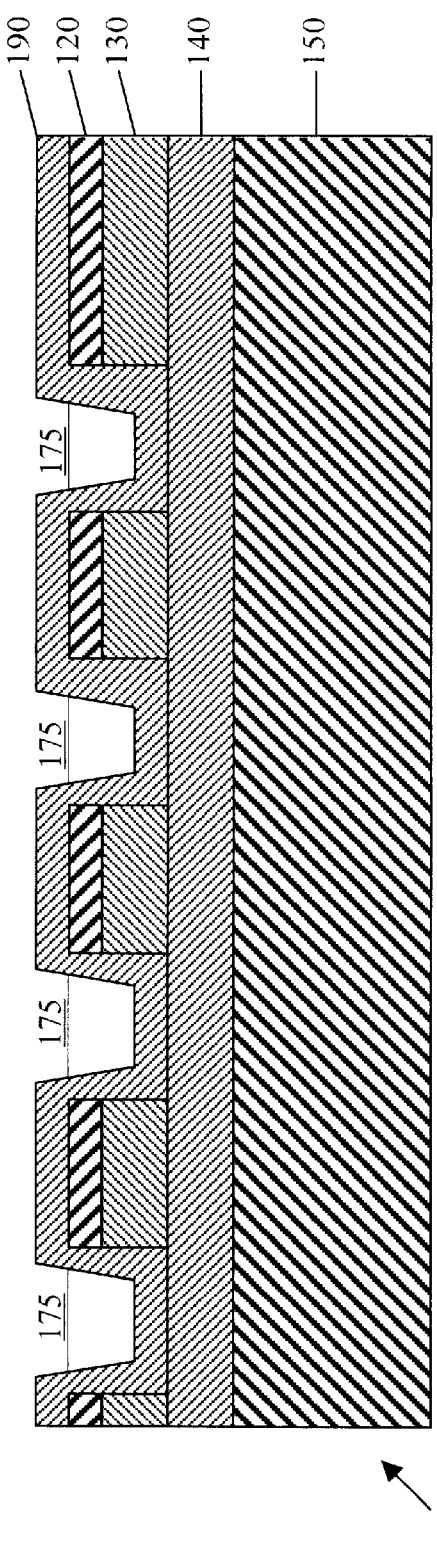
FIG. 7 is a schematic cross-sectional view representation of the portion of the integrated circuit of FIG. 2, showing an amorphous carbon layer deposition step.

FIG. 7 illustrates portion 100 after a deposition of an amorphous carbon film 190 over ARC layer 120 and walls of apertures 175. In an exemplary embodiment, amorphous carbon film 190 has a thickness of 40 nm. Amorphous carbon film 190 can be conformally deposited using a variety of techniques. In an exemplary embodiment, amorphous carbon film 190 is deposited using chemical vapor deposition (CVD).

Figure 8:
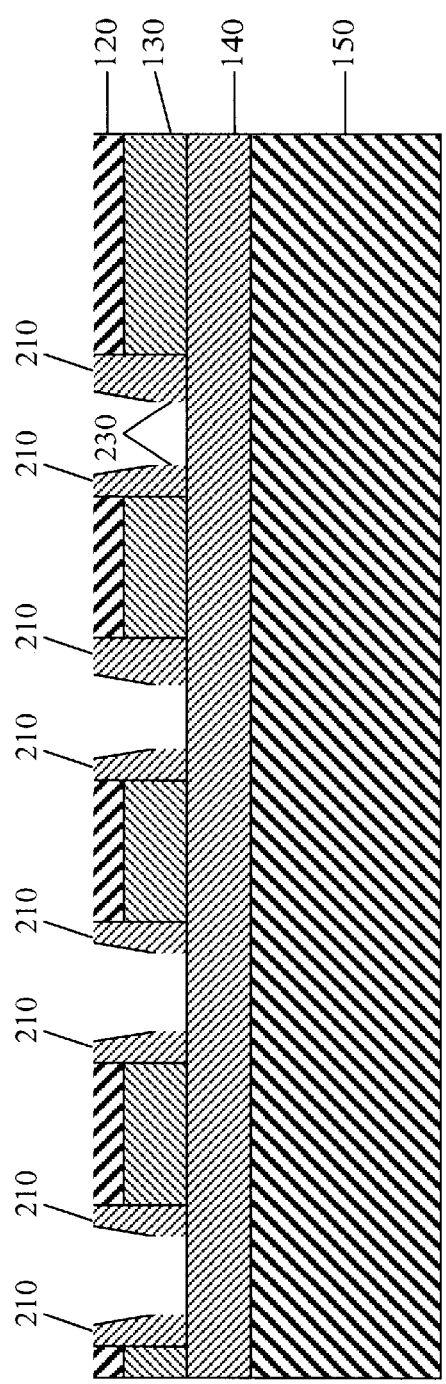
FIG. 8 is a schematic cross-sectional view representation of the portion of the integrated circuit of FIG. 2, showing a spacer formation step.

FIG. 8 illustrates portion 100 after formation of spacers 210 adjacent to lateral side walls in apertures 175. Spacers 210 are formed using a procedure by which amorphous carbon film 190 is etched back. Spacers 210 can include amorphous carbon material and can have a width of 40 nm at their widest point. In an exemplary embodiment, spacers 210 have rounded and tapered shapes. Alternatively, spacers 210 can have rectangular shapes or other shapes.

Spacers 210 can be considered to have reduced the width of apertures 175 to a distance 230. In an exemplary embodiment, distance 230 is 100 nm or less.

Figure 9:
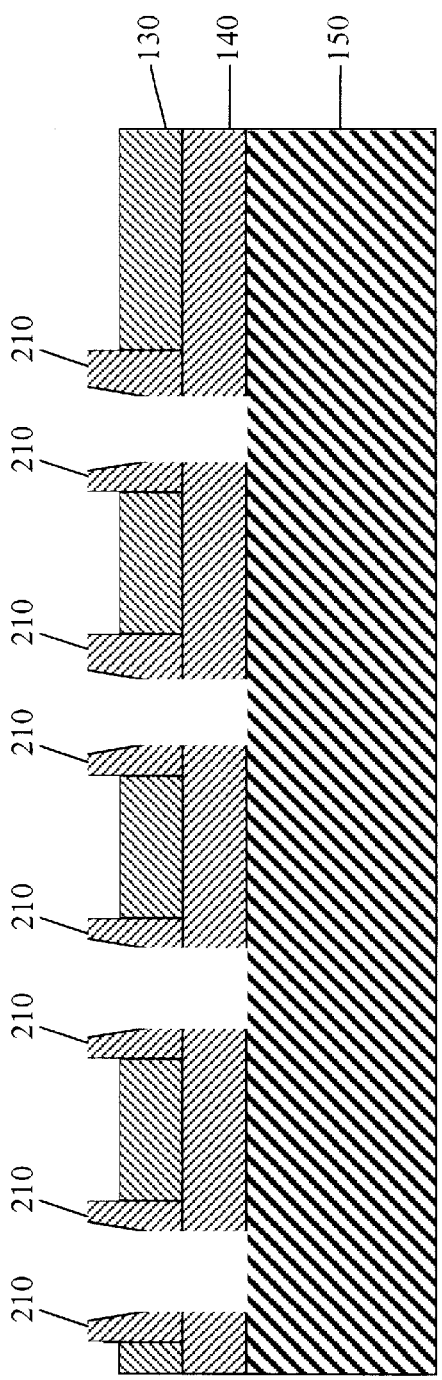
FIG. 9 is a schematic cross-sectional view representation of the portion of the integrated circuit of FIG. 2, showing an anti-reflective coating (ARC) removal step.

FIG. 9 illustrates portion 100 after removal of ARC layer 120. ARC layer 120 can be removed using a variety of different techniques, such as plasma etching or reactive ion etching. Alternatively, ARC layer 120 can be removed during the process of etching the polysilicon. The first step of the polysilicon etch can consist of a breakthrough step using fluorine containing gases. This step can be designed to ensure removal of the ARC layer. Alternatively, the poly etch itself can be designed to remove the ARC layer by including a small amount of F-containing gas in the poly etch chemistry.

Figure 10:
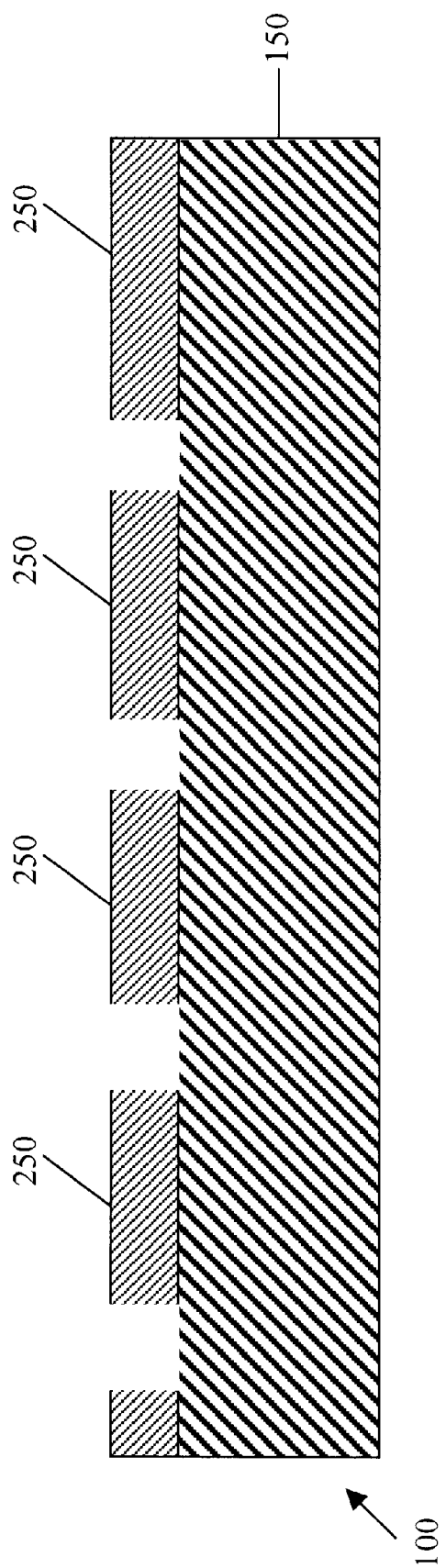
FIG. 10 is a schematic cross-sectional view representation of the portion of the integrated circuit of FIG. 2, showing a removal step.

FIG. 10 illustrates portion 100 after removal of amorphous carbon layer 130 and spacers 210. This removal can be accomplished by an $O_2$ plasma ashing. An ashing procedure is advantageous because it facilitates the removal of amorphous carbon layer 130 and spacers 210 without damaging substrate 150 or any underlying layers that may be positioned between polysilicon layer 140 and substrate 150. In particular, it avoids having to use hot phosphoric acid to remove a SiN ARC, which would also attack the underlying ONO layer. Other removal processes can be envisioned, such as solvents. After amorphous carbon layer 130 and spacers 210 are removed, patterned polysilicon structures 250 remain.

Advantageously, the process described with reference to the FIGURES allows for the formation of spaces smaller than easily achievable through conventional lithographic techniques. Further, the removal of the ARC and hard mask used conventionally to pattern the spaces is simplified such that underlying films are not damaged. Dimensions that are achievable in this process include spaces of less than 130 nm or between 0 nm and 130 nm. Further, polysilicon structures 250 having a critical dimension (CD) of 200 nm or greater can be formed as dictated by the lithographic resolution limit.

While the exemplary embodiments illustrated in the FIGURES and described above are presently preferred, it should be understood that these embodiments are offered by way of example only. Other embodiments may include, for example, formation of gates or other integrated circuit features. The invention is not limited to a particular embodiment, but extends to various modifications, combinations, and permutations that nevertheless fall within the scope and spirit of the appended claims.

What is claimed is:

1. A method of forming spaces between polysilicon lines, the method comprising:
    patterning structures having top SiON layers and bottom amorphous carbon layers, the structures being located over a polysilicon layer and being separated by a first width;
    forming amorphous carbon spacers along lateral side walls of the patterned structures;
    etching apertures into the polysilicon layer not covered by the amorphous carbon spacers and the patterned structures, the apertures in the polysilicon layer between adjacent patterned structures having a second width, the second width being less than the first width; and
    ashing away the amorphous carbon spacers and the patterned structures.

2. The method of claim 1, wherein the first width is between 50 nm and 300 nm.

3. The method of claim 1, wherein the second width is 100 nm or less.

4. The method of claim 1, wherein the polysilicon layer is located over an oxide-nitride-oxide (ONO) stack and the ONO stack is not damaged by the ashing away the amorphous carbon spacers and the patterned structures.

5. The method of claim 1, wherein ashing away the amorphous carbon spacers and the patterned structures includes providing a $O_2$ plasma.

6. The method of claim 1, wherein the top SiON layers have thicknesses of between 5 and 100 nm.

7. The method of claim 1, wherein the bottom amorphous carbon layers have thicknesses of between 30 and 100 nm.

8. The method of claim 1, further comprising depositing an amorphous carbon layer over a polysilicon layer and a SiON layer over the amorphous carbon layer.

9. The method of claim 8, wherein depositing an amorphous carbon layer and a SiON layer includes a chemical vapor deposition (CVD).

10. A method of forming structures having sub-lithographic spacing, the method comprising:
    patterning a first stack having a layer of amorphous carbon and a second stack having a layer of amorphous carbon, the first stack and the second stack being separated by a first width;
    forming amorphous carbon spacers along lateral side walls of the first stack and the second stack;
    etching a layer located below the first and second stacks using the first and second stacks and amorphous carbon spacers as a mask to leave at least two features, the distance between the at least two features is less than the first width; and
    removing the first and second stacks and the amorphous carbon spacers.

11. The method of claim 10, wherein the first width is 200 nm.

12. The method of claim 10, wherein the second width is 130 nm.

13. The method of claim 10, wherein the amorphous carbon spacers have widths of 40 nm.

14. The method of claim 10, wherein removing the first and second stacks and the amorphous carbon spacers includes an ashing process.

15. The method of claim 10, wherein the first and second stacks have layers of SiON.

16. A method of forming spaces between polysilicon lines, the method comprising:
    patterning SiON on amorphous carbon to form first and second stacks separated by a first width;
    depositing and etching amorphous carbon to form spacers along side walls of the first and second stacks;
    etching a polysilicon layer below the first and second stacks using the first and second stacks and spacers as a mask; and
    ashing away the first and second stack and the spacers.

17. The method of claim 16, further comprising in situ removal of SiON in the first and second stacks.

18. The method of claim 17, wherein the ashing includes a $O_2$ plasma that removes the amorphous carbon material in the first and second stacks and spacers, the in situ removal of SiON in the first and second stacks being done during the polysilicon layer etching step.

19. The method of claim 16, wherein the etched polysilicon between the first and second stacks has a width of 130 nm or less.

20. The method of claim 16, wherein the polysilicon layer is located over an oxide-nitride-oxide (ONO) layer.

* * * * *